US012002649B2

(12) United States Patent
Mitchell et al.

(10) Patent No.: US 12,002,649 B2
(45) Date of Patent: *Jun. 4, 2024

(54) SPINNING DISK WITH ELECTROSTATIC CLAMPED PLATENS FOR ION IMPLANTATION

(71) Applicant: Applied Materials, Inc., Santa Clara, CA (US)

(72) Inventors: Robert Mitchell, Winchester, MA (US); Frank Sinclair, Hartland, ME (US); Joseph C. Olson, Beverly, MA (US); William T. Weaver, Austin, TX (US); Nick Parisi, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 350 days.

This patent is subject to a terminal disclaimer.

(21) Appl. No.: 17/547,623

(22) Filed: Dec. 10, 2021

(65) Prior Publication Data

US 2023/0187166 A1 Jun. 15, 2023

(51) Int. Cl.
*H01J 37/20* (2006.01)
*C23C 14/48* (2006.01)
(Continued)

(52) U.S. Cl.
CPC .............. *H01J 37/20* (2013.01); *C23C 14/48* (2013.01); *C23C 14/505* (2013.01);
(Continued)

(58) Field of Classification Search
CPC ................... H01J 37/20; H01J 37/3171; H01J 2237/20214; C23C 15/505; C23C 15/48; H01L 21/6833
See application file for complete search history.

(56) References Cited

U.S. PATENT DOCUMENTS 5,126,576 A * 6/1992 Wauk, II ............. H01J 37/3171
250/492.2
5,641,696 A * 6/1997 Takeuchi ............... H10B 41/30
438/257
(Continued)

FOREIGN PATENT DOCUMENTS

| JP | 2007-533078 A | 11/2007 |
| KR | 2020-0115914 A | 10/2020 |
| TW | 201734671 A | 10/2017 |

OTHER PUBLICATIONS

International Search Report and Written Opinion mailed Apr. 4, 2023 in corresponding PCT application No. PCT/US2022/050418.

*Primary Examiner* — David E Smith
(74) *Attorney, Agent, or Firm* — NIELDS, LEMACK & FRAME, LLC (57) ABSTRACT

A system comprising a spinning disk is disclosed. The system comprises a semiconductor processing system, such as a high energy implantation system. The semiconductor processing system produces a spot ion beam, which is directed to a plurality of workpieces, which are disposed on the spinning disk. The spinning disk comprises a rotating central hub with a plurality of platens. The plurality of platens may extend outward from the central hub and workpieces are electrostatically clamped to the platens. The plurality of platens may also be capable of rotation. The central hub also controls the rotation of each of the platens about an axis orthogonal to the rotation axis of the central hub. In this way, variable angle implants may be performed. Additionally, this allows the workpieces to be mounted while in a horizontal orientation.

20 Claims, 10 Drawing Sheets

(51) Int. Cl.
 *C23C 14/50* (2006.01)
 *H01J 37/317* (2006.01)
 *H01L 21/683* (2006.01)

(52) U.S. Cl.
 CPC ...... *H01J 37/3171* (2013.01); *H01L 21/6833* (2013.01); *H01J 2237/20214* (2013.01)

(56) References Cited

U.S. PATENT DOCUMENTS

| | | |
|---|---|---|
| 6,222,196 B1 | 4/2001 | Mack |
| 6,580,082 B1 | 6/2003 | Mitchell |
| 6,583,428 B1 | 6/2003 | Chipman et al. |
| 6,727,509 B2 | 4/2004 | Pharand et al. |
| 6,734,439 B2 | 5/2004 | Weed et al. |
| 6,965,116 B1 * | 11/2005 | Wagner ............... H01J 37/3171 250/397 |
| 7,267,520 B2 | 9/2007 | Kellerman et al. |
| 11,670,532 B1 * | 6/2023 | Peitzsch ................. H01J 37/20 250/492.21 |
| 2003/0111617 A1 | 6/2003 | Pharand et al. |
| 2010/0025597 A1 * | 2/2010 | Kasamatsu ............. H01J 37/20 250/492.21 |
| 2010/0327178 A1 * | 12/2010 | Glavish .................. H01J 37/08 250/396 ML |
| 2011/0007291 A1 | 1/2011 | Ichinose |
| 2011/0186743 A1 | 8/2011 | Ruffell |
| 2021/0335642 A1 | 10/2021 | Gwinn et al. |

\* cited by examiner

SPINNING DISK WITH ELECTROSTATIC CLAMPED PLATENS FOR ION IMPLANTATION

FIELD

Embodiments of this disclosure are directed to systems and methods for holding, handling and processing workpieces using a spinning disk.

BACKGROUND

High energy implantation systems are used to create semiconductor devices that have deep implanted regions. One specific type of device is referred to as an insulated gate bipolar transistor (IGBT). An IGBT combines concepts from bipolar transistors and MOSFETs to achieve an improved power device. The emitter and the gate are disposed on one side of the device, while the collector is disposed on the opposite second side of the device. The emitter is in communication with a heavily p-doped region disposed directly below the emitter. On either side of the heavily p-doped region are heavily n-doped regions, each in communication with the gate. Beneath the heavily p-doped region is a lightly p-doped region. On the opposite side of the device is a second heavily p-doped region, in communication with the collector. Finally, between the second heavily p-doped region and the lightly p-doped region is a lightly n-doped drift layer.

In conventional IGBT devices, the thickness of the lightly n-doped drift layer is determined based on the need to sustain the electrical field. As the power ratings for these devices increases, the overall thickness of the device also increases.

High energy implants may be used to create these devices. However, one shortcoming of these devices may be angular spread. Traditionally, in these implantation systems, a spot beam is generated, which is then electrostatically scanned to create a ribbon ion beam that strikes the workpiece. However, non-uniformities in angular spread may be exacerbated by the electrostatic scanner.

Therefore, it would be beneficial if there were a semiconductor processing system that could perform high energy implants without the drawbacks of the present technologies. More particularly, it would be beneficial if there were a system that performs high energy implants on a batch of workpieces that are electrostatically clamped.

SUMMARY

A system comprising a spinning disk is disclosed. The system comprises a semiconductor processing system, such as a high energy implantation system. The semiconductor processing system produces a spot ion beam, which is directed to a plurality of workpieces, which are disposed on the spinning disk. The spinning disk comprises a rotating central hub with a plurality of platens. The plurality of platens may extend outward from the central hub and workpieces are electrostatically clamped to the platens. The plurality of platens may also be capable of rotation. The central hub also controls the rotation of each of the platens about an axis orthogonal to the rotation axis of the central hub. In this way, variable angle implants may be performed. Additionally, this allows the workpieces to be mounted while in a horizontal orientation.

According to one embodiment, a spinning disk to process a plurality of workpieces is disclosed. The spinning disk comprises a central hub adapted to rotate about a central axis; a plurality of spokes extending radially outward from the central hub, wherein each of the plurality of spokes is adapted to rotate about a respective axis extending radially from the central hub; a platen disposed on a distal end of each of the plurality of spokes, each platen comprising a plurality of electrodes and configured to electrostatically clamp a respective workpiece; and a plurality of rotary motors disposed in the central hub, each in communication with a respective one of the plurality of spokes and configured to rotate the respective one of the plurality of spokes. In certain embodiments, each rotary motor rotates the respective one of the plurality of spokes at an angle between −90° and 90°. In some embodiments, each rotary motor rotates the respective one of the plurality of spokes at an angle up to 180°. In some embodiments, the spinning disk comprises a sensor disposed on a back surface of at least one of the platens to measure a characteristic of an ion beam. In some embodiments, the sensor comprises an array of holes. In some embodiments, the sensor comprises a slot.

According to another embodiment, an ion implantation system is disclosed. The system comprises an ion source to generate ions; an accelerator to accelerate the ions and create a spot beam; and the spinning disk described above. In some embodiments, the spinning disk is configured to translate in a direction perpendicular to the central axis resulting in a two dimensional mechanical scanning. In some embodiments, the central hub is rotatably mounted to a structure, wherein the structure translates linearly in a direction perpendicular to the central axis. In some embodiments, the central hub is rotatably mounted to a pivoting arm, wherein the pivoting arm rotates so as to translate the spinning disk in a direction perpendicular to the central axis.

According to another embodiment, a spinning disk to process a plurality of workpieces is disclosed. The spinning disk comprises a central hub adapted to rotate about a central axis; a hub controller disposed within the central hub; a plurality of spokes extending radially outward from the central hub, wherein each of the plurality of spokes is adapted to rotate about a respective axis extending radially from the central hub; a platen disposed on a distal end of each of the plurality of spokes and configured to electrostatically clamp a respective workpiece; and a plurality of rotary motors disposed in the central hub, each in communication with a respective one of the plurality of spokes and configured to rotate the respective one of the plurality of spokes. In some embodiments, the hub controller is configured to execute a sequence to mount a workpiece on a platen, the sequence to mount the workpiece comprising: actuating one of the plurality of rotary motors to rotate a platen such that a front surface of the platen is horizontal to allow a workpiece to be placed on the front surface; and enabling electrostatic clamping of the platen after the workpiece has been placed on the front surface. In some embodiments, the spinning disk comprises valves to regulate a flow of backside gas to one or more of the platens. In some embodiments, the sequence to mount the workpiece further comprises enabling a flow of backside gas after the workpiece has been electrostatically clamped. In some embodiments, the sequence to mount the workpiece further comprises actuating one of the plurality of rotary motors to rotate a platen such that a front surface of the platen is at a desired angle of implant after the workpiece has been electrostatically clamped. In some embodiments, the hub controller is configured to execute a sequence to dismount a workpiece from a platen, the sequence comprising: actuating one of the plurality of rotary motors to rotate a platen such that a front surface of the platen is horizontal to allow a workpiece to be removed from the front surface; and disabling electrostatic clamping of the platen after the platen is rotated to a horizontal position. In some embodiments, the spinning disk comprises valves to regulate a flow of backside gas to one or more of the platens. In some embodiments, the sequence to dismount the workpiece further comprises disabling a flow of backside gas before the electrostatic clamping has been disabled. In certain embodiments, the spinning disk comprises a sensor disposed on a back surface of at least one of the platens and wherein the hub controller is configured to execute a sequence to measure characteristics of an incoming ion beam, the sequence comprising: actuating one of the plurality of rotary motors to rotate a platen such that a back surface of the platen is exposed to the incoming ion beam so that the incoming ion beam strikes the sensor; and receiving an output from the sensor, wherein the output is indicative of a characteristic of the incoming ion beam. In certain embodiments, the spinning disk comprises a temperature sensor disposed in one or more of the platens, wherein the hub controller monitors a temperature of the platen.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes the use of a spinning disk in conjunction with a semiconductor processing system to implant ions with high energy and low angular spread. There are various semiconductor processing systems that may be used with the spinning disk.

Figure 1A:
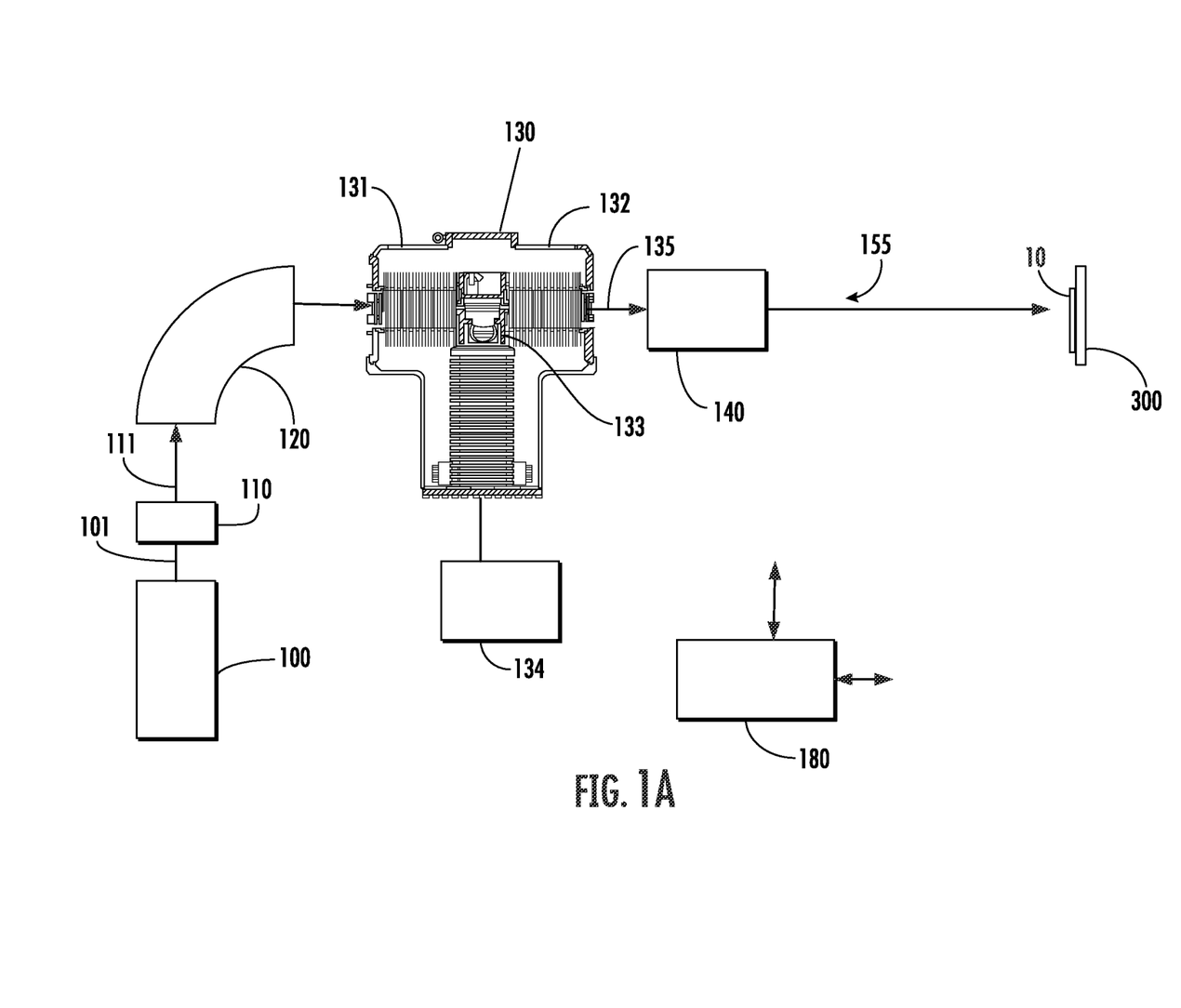
FIG. 1A shows a semiconductor processing apparatus that may be utilized according to one embodiment.

As shown in FIG. 1A, a semiconductor processing system comprises an ion source 100, which is used to generate an ion beam. In one embodiment, a positive ion beam 101 may be created in the traditional manner, such as using a Bernas or indirectly heated cathode (IHC) ion source. Of course, other types of ion sources may also be employed. A feedgas is supplied to the ion source 100, which is then energized to generate ions. In certain embodiments, the feedgas may be hydrogen, boron, phosphorus, arsenic, helium, or other suitable species. Extraction optics are then used to extract these ions from the ion source 100.

The positive ion beam 101 exiting the ion source 100 may be coupled to a Mg charge exchange cell 110, which transforms the positive ion beam 101 into a negative ion beam 111. Of course, other mechanisms for the generation of a negative ion beam are known in the art. The mechanism used to create the negative ion beam is not limited by this disclosure.

The negative ion beam 111 may be directed toward a mass analyzer 120, which only allows the passage of certain species of ions. The negative ions that exit the mass analyzer 120 are directed toward a tandem accelerator 130.

The tandem accelerator 130 has two pathways, which are separated by a stripper tube 133. The input pathway 131 comprises a plurality of input electrodes. These input electrodes may be any suitable electrically conductive material, such as titanium or other metals. The outermost input electrode may be grounded. Each of the subsequent input electrodes may be biased at an increasingly more positive voltage moving closer to the stripper tube 133.

The input pathway 131 leads to the stripper tube 133. The stripper tube 133 is biased positively relative to the outermost input electrode. The stripper tube 133 includes an injection conduit where a stripper gas is injected. The stripper gas may comprise neutral molecules. These neutral molecules may be any suitable species such as, but not limited to argon and nitrogen. The stripper tube 133 has an inlet disposed on the same side as the input pathway 131. The outlet of the stripper tube 133 is in communication with the output pathway 132.

In other words, the stripper tube 133 is positively biased so as to attract the negative ion beam 111 through the input pathway 131. The stripper tube 133 removes electrons from the incoming ions, transforming them from negative ions into positive ions.

The stripper tube 133 is more positive than the electrodes in the output pathway 132. Each subsequent output electrode may be less positively biased moving away from the stripper tube 133. For example, the outermost output electrode may be grounded. Thus, the positive ions in the stripper tube 133 are accelerated through the output pathway 132.

In this way, the ions are accelerated two times. First, negative ions are accelerated through the input pathway 131 to the stripper tube 133. This acceleration is based on the difference between the voltage of the outermost input electrode and the voltage of the stripper tube 133. Next, positive ions are accelerated through the output pathway 132. This acceleration is based on the difference between the voltage of the stripper tube 133 and the voltage of the outermost output electrode in the output pathway 132.

An accelerator power supply 134 may be used to supply the voltages to the stripper tube 133, as well as the electrodes in the input pathway 131 and the output pathway 132. The accelerator power supply 134 may be capable of supply a voltage up to 2.5 MV, although other voltages, either higher or lower, are also possible. Thus, to modify the implant energy, the voltage applied by the accelerator power supply 134 is changed.

After exiting the tandem accelerator 130, the positive ion beam 135 may enter a filter magnet 140, which allows passage of ions of only a certain charge. In other embodiments, the filter magnet 140 may not be employed.

The output of the filter magnet, which may be a spot ion beam 155, is then directed toward the spinning disk 300. A workpiece 10 may be disposed on each of the plurality of platens disposed on the spinning disk. In certain embodiments, a corrector magnet may be disposed between the filter magnet 140 and the spinning disk 300.

Additionally, the semiconductor processing apparatus includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the accelerator power supply 134, so as to control the implant energy. In addition, the controller 180 may be in communication with the spinning disk 300 as described in more detail below. The controller 180 may also be in communication with other components.

Figure 1B:
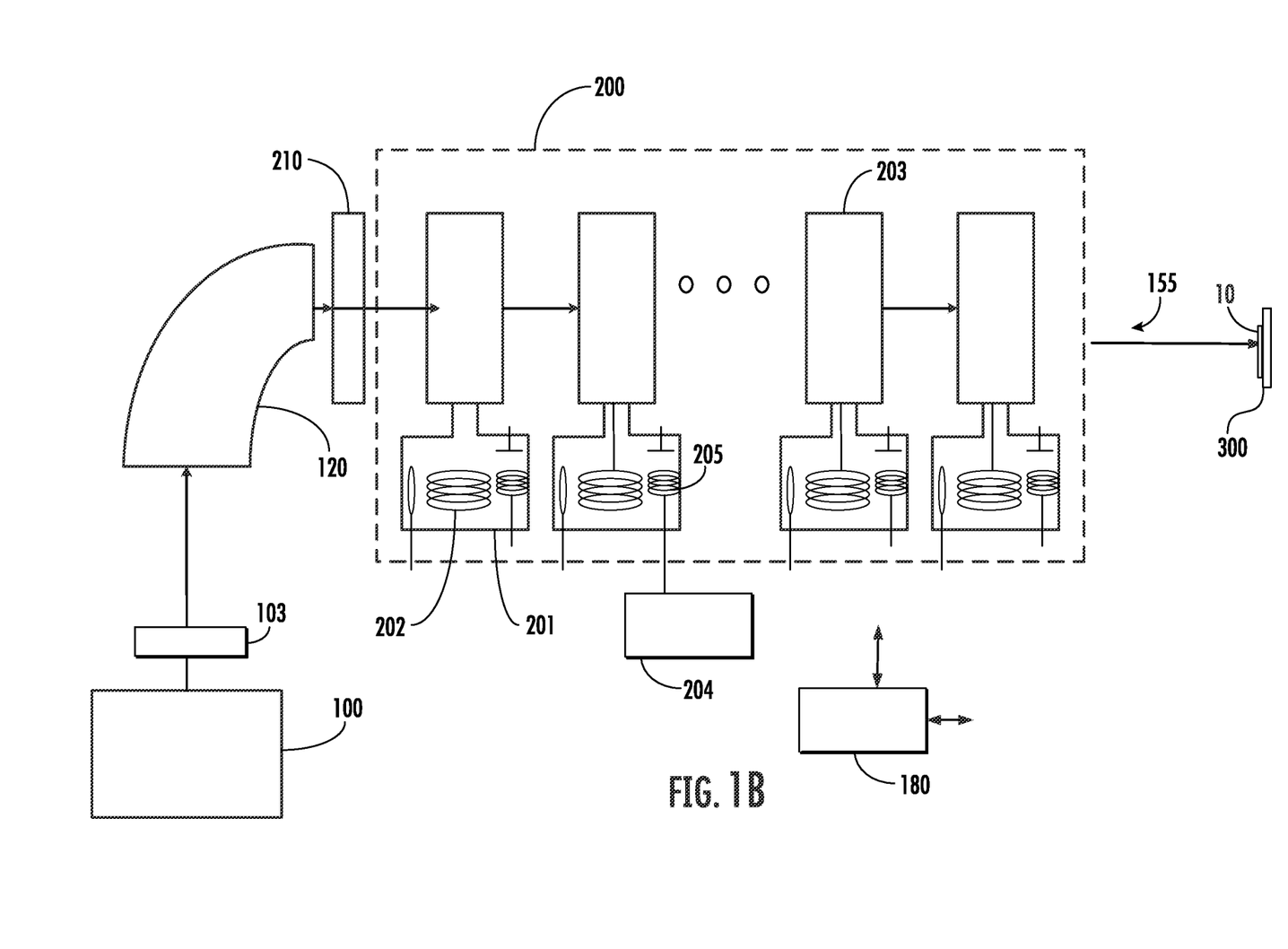
FIG. 1B shows a semiconductor processing apparatus that may be utilized according to a second embodiment.

A second embodiment is shown in FIG. 1B. Components that are common with FIG. 1A are given identical reference designators.

As described above, a semiconductor processing system comprises an ion source 100, which is used to generate an ion beam. The ion source 100 has an aperture through which ions may be extracted from the ion source 100. These ions may be extracted from the ion source 100 by applying a negative voltage to the extraction optics 103 disposed outside the ion source 100, proximate the extraction aperture. The ions may then enter a mass analyzer 120, which may be a magnet that allows ions having a particular mass to charge ratio to pass through. This mass analyzer 120 is used to separate only the desired ions. It is the desired ions that then enter the linear accelerator 200.

The desired ions then enter a buncher 210, which creates groups or bunches of ions that travel together. The buncher 210 may comprise a plurality of drift tubes, wherein at least one of the drift tubes may be supplied with an AC voltage. One or more of the other drift tubes may be grounded. The drift tubes that are supplied with the AC voltage may serve to accelerate and manipulate the ion beam into discrete bunches.

The linear accelerator 200 comprises one or more cavities 201. Each cavity 201 comprises a resonator coil 202 that may be energized by electromagnetic fields created by an excitation coil 205. The excitation coil 205 is disposed in the cavity 201 with a respective resonator coil 202. The excitation coil 205 is energized by an excitation voltage, which may be a RF signal. The excitation voltage may be supplied by a respective RF generator 204. In other words, the excitation voltage applied to each excitation coil 205 may be independent of the excitation voltage supplied to any other excitation coil 205. Each excitation voltage is preferably modulated at the resonance frequency of its respective cavity 201.

When an excitation voltage is applied to the excitation coil 205, a voltage is induced on the resonator coil 202. The result is that the resonator coil 202 in each cavity 201 is driven by a sinusoidal voltage. Each resonator coil 202 may be in electrical communication with a respective accelerator electrode 203. The ions pass through apertures in each accelerator electrode 203.

The entry of the bunch into a particular accelerator electrode 203 is timed such that the potential of the accelerator electrode 203 is negative as the bunch approaches, but switches to positive as the bunch passes through the accelerator electrode 203. In this way, the bunch is accelerated as it enters the accelerator electrode 203 and is repelled as it exits. This results in an acceleration of the bunch. This process is repeated for each accelerator electrode 203 in the linear accelerator 200. Each accelerator electrode 203 increases the acceleration of the ions.

After the bunch exits the linear accelerator 200, the ions, which may be a spot ion beam 155, are directed toward spinning disk 300.

The controller 180 may be in communication with the RF generator 204, so as to control the implant energy. In addition, the controller 180 may be in communication with the spinning disk 300 as described in more detail below. The controller 180 may also be in communication with other components.

Of course, the ion implantation system may include other components, such as quadrupole elements, additional electrodes to accelerate or decelerate the beam and other elements.

Figure 2A:
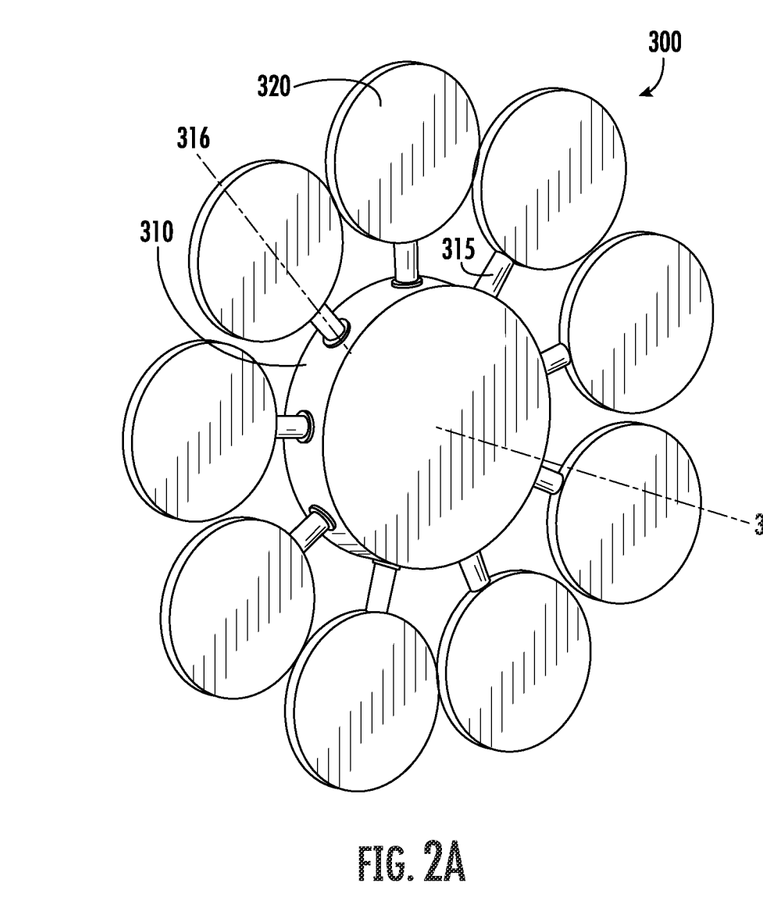
FIG. 2A shows a spinning disk according to one embodiment.
Figure 2B:
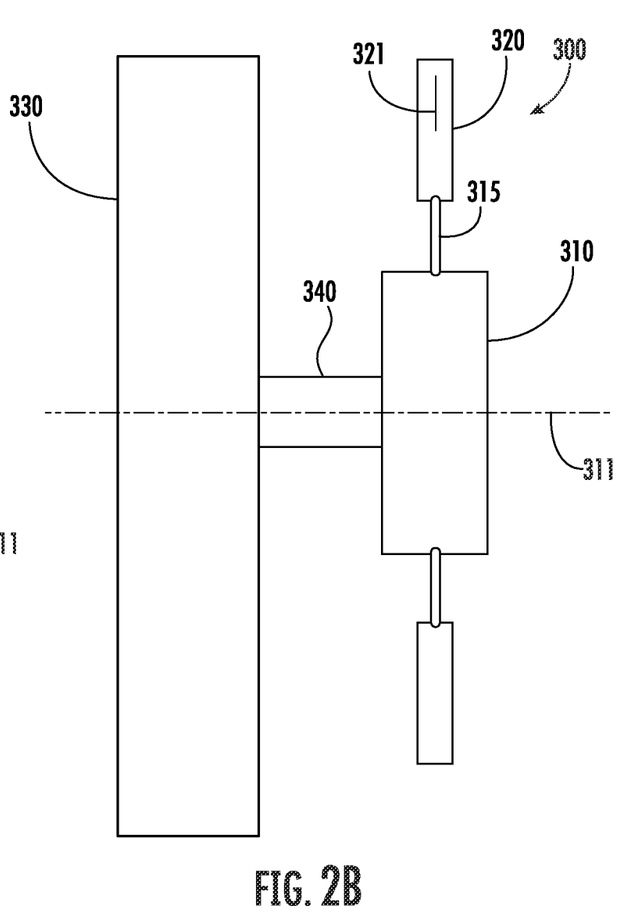
FIG. 2B shows a side view of the spinning disk of FIG. 2A.

In both of these embodiments, the ion implantation system comprises an ion source, and an accelerator to accelerate the ions. The output from the semiconductor processing system, which may be a spot ion beam 155, is directed toward a spinning disk 300. One embodiment of a spinning disk 300 is shown in FIG. 2A. A side view of this spinning disk is shown in FIG. 2B.

The spinning disk 300 comprises a central hub 310, which rotates about a central axis 311. The spinning disk 300 may be connected to a structure 330 using a spindle assembly 340. Alternatively, the spinning disk 300 may be mounted to a pivoting arm, as described in more detail below.

Extending outward from the central hub 310 are a plurality of spokes 315, each with a respective platen 320 attached to the distal end of the spoke 315. There may be between four and twenty or more platens 320. In some embodiments, the platens 320 may be approximately 12 inches in diameter, and the central hub 310 may be between 12 and 24 inches in diameter. The platens 320 may be fixedly attached to the spokes 315.

Figure 9A:
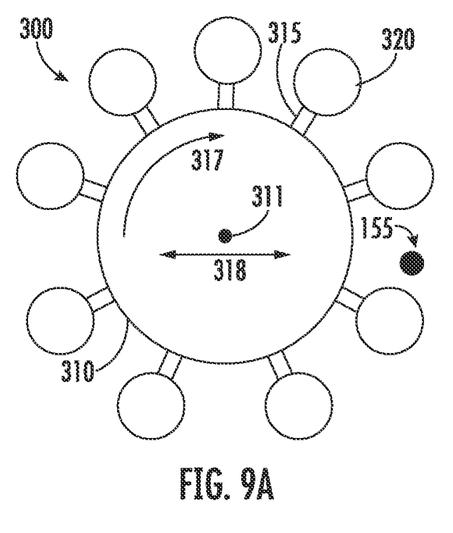
FIGS. 9A-9B show the relationship between the spinning disk and spot ion beam according to two embodiments.

As seen in FIG. 9A, in operation, a spot ion beam 155 is directed toward an area near the spinning disk 300. The central hub 310 rotates along path 317 about central axis 311. In certain embodiments, the speed of rotation may be between 30 RPM and 1000 RPM. In other embodiments, the speed of rotation may be 300 RPM or less. Of course, other rates of rotation are also possible. Additionally, the central hub 310 may be translated linearly, such as horizontally along path 318 by moving the structure 330. The linear speed may be between 100 and 500 mm/sec, although other speeds are also possible. The path 318 is defined such that at the two ends of the path, the spot ion beam 155 does not strike a platen 320. In other words, at one end of the path 318, the spot ion beam 155 is beyond the outermost edge of the platen 320. At the other end of path 318, the spot ion beam 155 is directed to the area between the central hub 310 and the inner edge of the platens 320. Thus, in certain embodiments, the spokes 315 are of a length that is greater than the maximum diameter of the spot ion beam 155 such that there is a position where the spot ion beam 155 is between the central hub 310 and the platens 320. In certain embodiments, the spokes 315 may be at least 6 inches in length. By including spokes 315, the central hub 310 is not impacted by the spot ion beam 155 as the central hub 310 is translated horizontally along path 318. Further, the path 318 may be perpendicular to the rotation of central hub 310 as the platen passes through the spot ion beam 155, resulting in a two dimensional mechanical scanning.

Figure 9B:
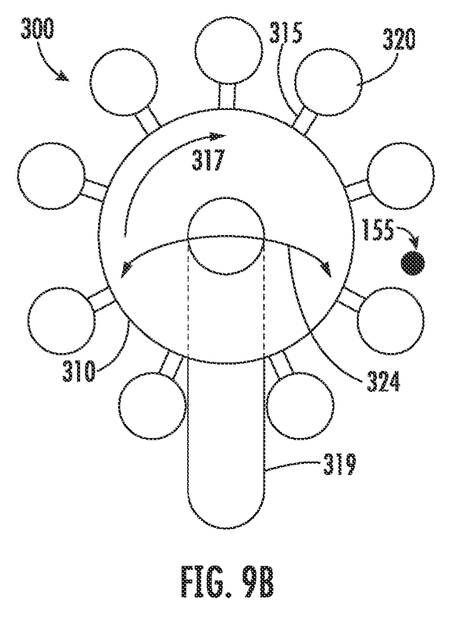

In another embodiment, shown in FIG. 9B, the spinning disk 300 is mounted on a pivoting arm 319. The length of the pivoting arm 319 may be sufficiently long such that the path 324 of the central hub 310 has a radius of curvature of between about 350 and 750 mm. In this way, the path 324 is roughly perpendicular to the rotation of central hub 310 as the platen passes through the spot ion beam 155, resulting in a two dimensional mechanical scanning.

Referring to FIG. 2B, the platens 320 may each utilize electrostatic clamping. The electrostatic clamping may be realized using either AC or DC voltages. In one embodiment, the top surface of the platens may be a dielectric material, such as a ceramic. Beneath the top surface may be a plurality of electrodes 321.

In the case of DC clamping, where may be two electrodes 321, wherein the first electrode is biased at a positive voltage having a predetermined magnitude and the second electrode is biased at a negative voltage having the same magnitude. The electrodes may be suitable shaped. In one embodiment, the two electrodes may be adjacent spirals. The magnitude of the DC voltages may be between 200 and 2000 V.

Figure 3:
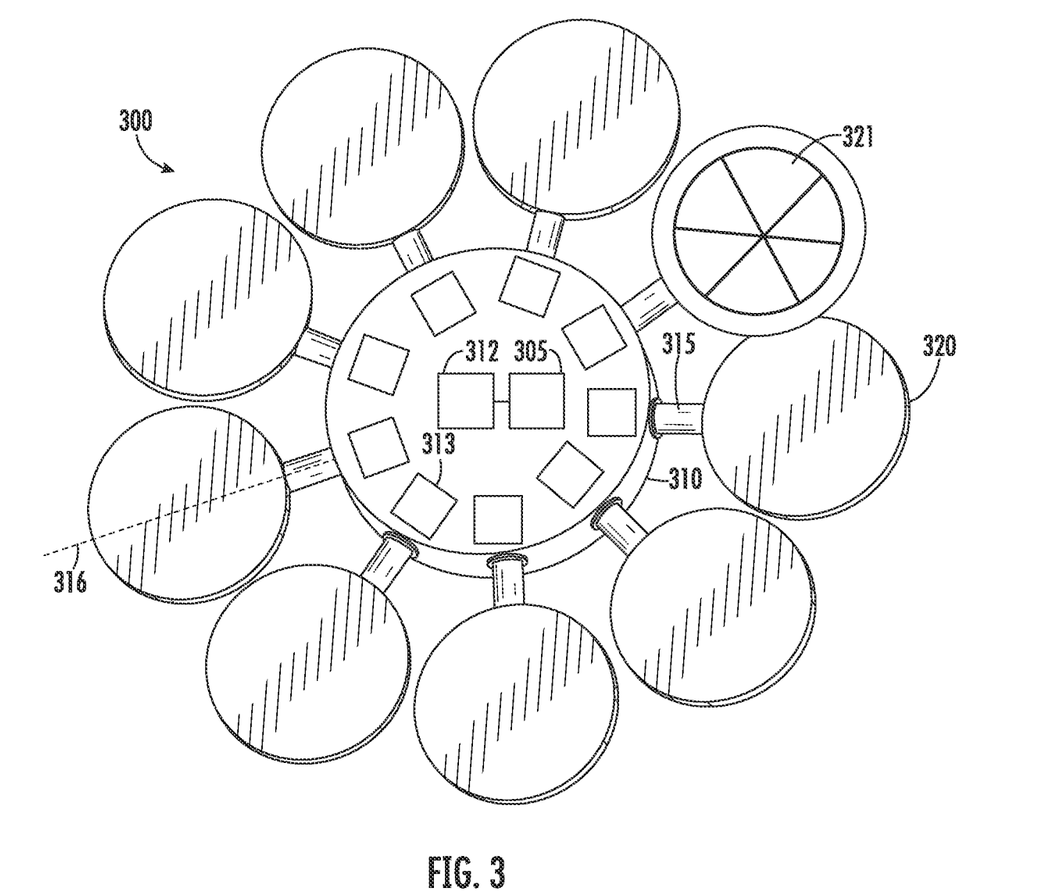
FIG. 3 shows a block diagram of the components of the spinning disk.

In the case of AC clamping, shown in FIG. 3, there may be an even number of electrodes 321, such as six electrodes. The electrodes 321 may be arranged in opposing pairs, where the phase of the two electrodes of the pair have a phase difference of 180°. Thus, each pair of electrodes may be in electrical communication with a respective bipolar power signal, such as a square wave, such that one electrode of a pair receives the positive output and the other electrode of that pair receives the negative output. The same square wave output, in terms of period and amplitude, is applied to all of the electrodes. However, each square wave output is phase shifted from those adjacent to it. The phase between adjacent electrodes may be equal to 360°/N, where N is the number of electrodes.

In certain embodiments, the frequency of the AC voltage or pulsed DC voltage may be between 1 and 60 Hz, while the amplitude may be between 200 and 4000 V. In certain embodiments, there are 6 electrodes, configured as three pairs. One pair of these electrodes is powered by a first square wave, while a second pair of electrodes is powered by a second square wave, which has a phase shift of 120° relative to the first square wave. Similarly, the third square wave is phase shifted 120° from the second square wave. Of course, other configurations are also within the scope of the disclosure.

In certain embodiments, the electrode power supply 305 is disposed within the central hub 310. In some embodiments, the electrode power supply 305 may generate the signals needed to electrostatically clamp a workpiece to each platen 320. In other embodiments, the signals needed to clamp the workpieces may be provided through the spindle assembly 340.

Each of the platens 320 is connected to the central hub 310 via a respective spoke 315. Within each spoke 315 are the electrical conduits for its respective platen 320. These electrical conduits include the electrical signals needed for the electrostatic clamping. Additionally, each spoke 315 may also carry coolant and backside gas. The coolant and backside gas may be supplied to the central hub 310 through spindle assembly 340. Various techniques, such as ferrofluid seals, may be used to deliver the gas and coolant to the central hub 310.

In some embodiments, within the central hub 310, there may be a separate valve for each platen 320 to supply backside gas to that platen. In other embodiments, there may be a valve to supply backside gas to a subset of the platens 320. For example, if there are 9 platens, there may be three valves in the central hub, each controlling the flow of backside gas to 3 of the platens. In yet another embodiment, there may be a single valve that is used to control the flow of backside gas to all of the platens 320. The backside gas usually is supply at between 4 and 20 Torr.

The flow of coolant to the platens 320 may be regulated by a valve disposed within the central hub 310 or outside of the central hub 310.

In certain embodiments, the spoke 315 and the corresponding platen 320 are rigidly attached to one another. Furthermore, in some embodiments, each spoke 315 is capable of rotational movement about an axis 316 that extends radially from the central hub 310. In other words, the spoke 315 can rotate with respect to the central hub 310 about an axis that is perpendicular to central axis 311. To control the rotation of the spokes 315, a rotary motor 313 is associated with each spoke 315, as shown in FIG. 3.

Additionally, as described above, the spokes 315 may rotate with respect to the central hub 310. Therefore, rotary motors 313, one for each platen 320, are also included in the central hub 310. In some embodiments, a hub controller 312 is disposed within the central hub 310. The hub controller 312 may include a processing unit, such as a microcontroller, a personal computer, a special purpose controller, or another suitable processing unit. The hub controller 312 may also include a non-transitory computer readable storage element, such as a semiconductor memory, a magnetic memory, or another suitable memory. This non-transitory storage element may contain instructions and other data that allows the hub controller 312 to perform the functions described herein.

The hub controller 312 receives communication signals 326 that pass through a spindle assembly 340 to the central hub 310. These communication signals 326 may be generated by controller 180, shown in FIGS. 1A-1B. Based on these communication signals 326, the hub controller 312 may perform a variety of functions. For example, the hub controller 312 may control the signals supplied to the electrodes 321 to be enabled and disabled. The signals to the electrodes 321 may be disabled when a workpiece is to be removed from a platen 320. The signals to the electrodes 321 may be enabled after a workpiece has been mounted on the platen 320, as described in more detail below.

Figure 10:
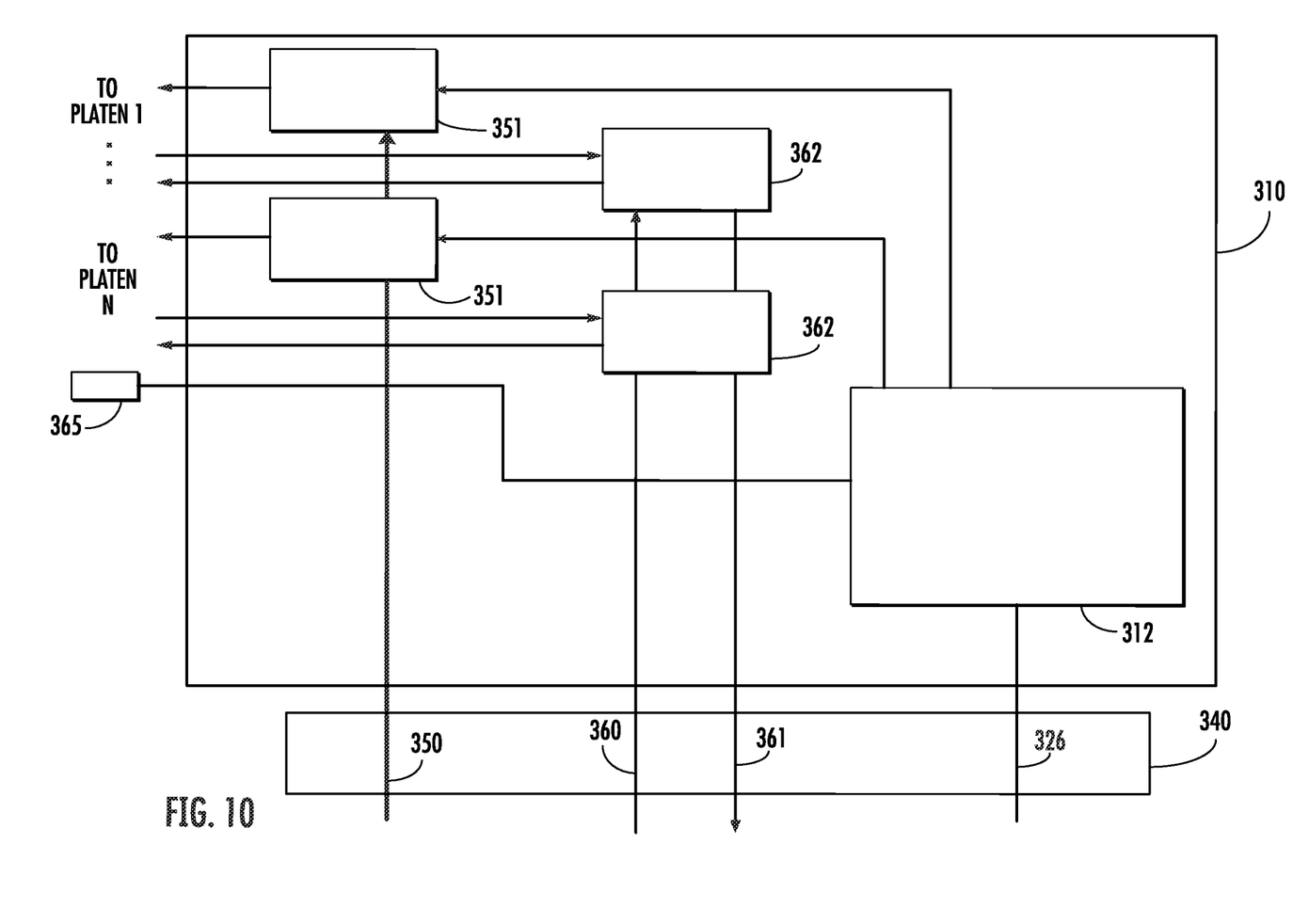
FIG. 10 shows a block diagram of the fluid connections within the central hub.

Additionally, the hub controller 312 may control valves for fluid flow to the platens 320. FIG. 10 shows a block diagram showing possible fluid flow paths. The hub controller 312 may control the flow of backside gas to each platen 320. For example, a fluid conduit 350 may pass through the spindle assembly 340 that carries backside gas. This fluid conduit 350 may then branch to each of the platens 320. In certain embodiments, the flow of backside gas to each platen 320 is independently controlled by the hub controller 312 through the use of a plurality of gas valves 351. In another embodiment, one gas valve 351 may be used to control the flow of backside gas to all of the platens 320.

The hub controller 312 may also control the flow of coolant to each platen 320. An inlet coolant conduit 360 and an outlet coolant conduit 361 may pass through the spindle assembly 340. In certain embodiments, the flow of coolant to each platen 320 is independently controlled by the hub controller 312 through the use of a plurality of coolant valves 362. In another embodiment, one coolant valve 362 may be used to control the flow of coolant to all of the platens 320.

In another embodiment, coolant valves 362 may not be used in the central hub 310. Rather, the flow of coolant to the platens 320 may be controlled outside of the central hub, such as by a coolant supply chiller.

The hub controller 312 may also monitor the temperature of each platen 320, such as through the use of temperature sensors 365, disposed in one or more of the platens 320. For example, the flow of coolant through the coolant valve 362 may be related to the temperature of the respective platen 320, as measured by the temperature sensor 365. Additionally, the hub controller 312 may also provide status and other information back to the controller 180 via communication signals 326.

In the case where there are no coolant valves 362 in the central hub 310, the hub controller 312 may provide the temperature information to the controller 180 via communication signals 326. The controller 180 may then use this information to control the coolant supply chiller.

Referring to FIG. 3, the hub controller 312 may also control the one or more rotary motors 313. The interior of the central hub 310 may be sealed from the vacuum environment that exists outside the central hub 310. In some embodiments, the interior of the central hub 310 may be maintained at atmospheric pressure. In other embodiments, the interior of the central hub 310 may be maintained at a pressure that is less than atmospheric pressure but greater than the pressure outside the central hub 310. In certain embodiments, the backside gas may be used to create the pressure in the interior of the central hub 310.

Figure 4A:
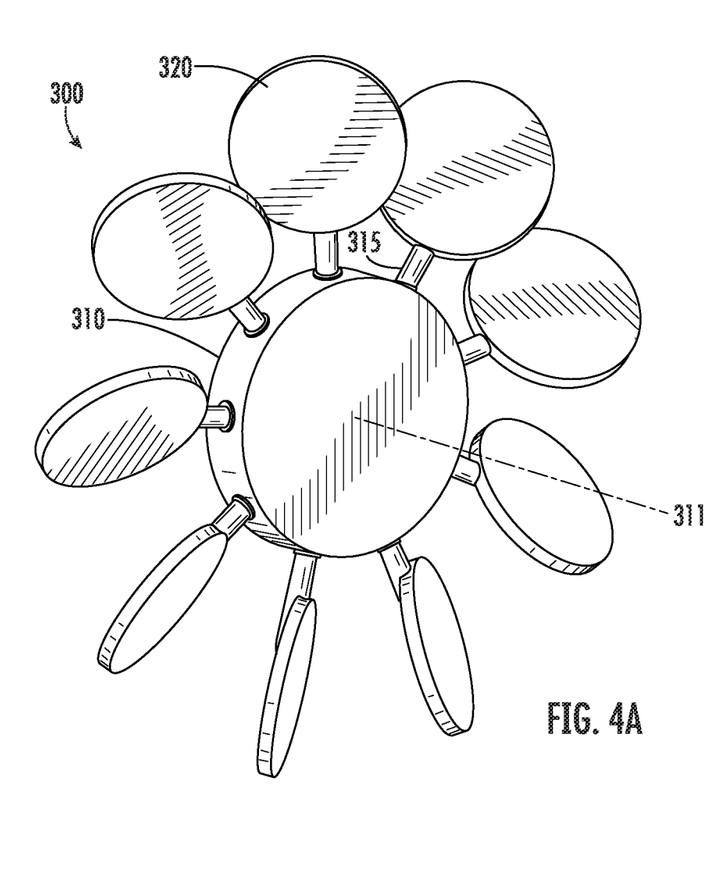
FIG. 4A shows the spinning disk of FIG. 2A where the platens are rotated at an angle of 45°.
Figure 4B:
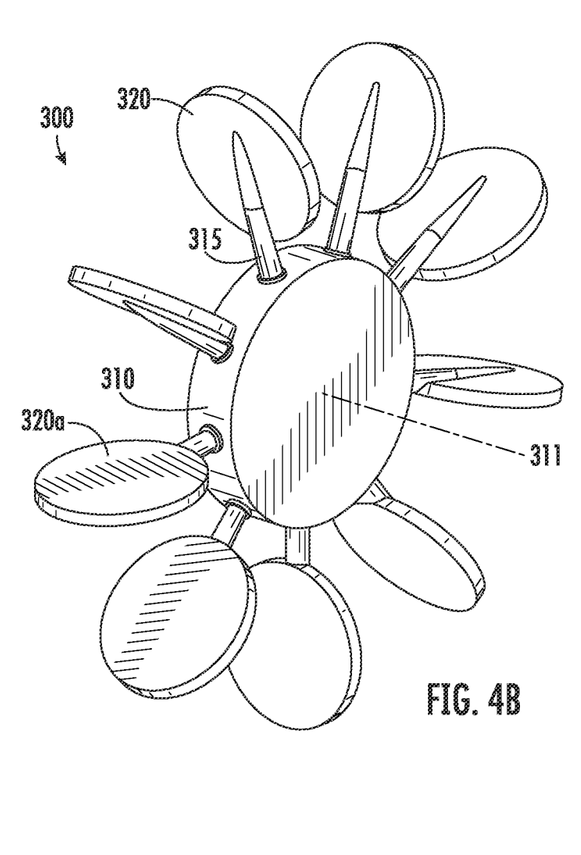
FIG. 4B shows the spinning disk of FIG. 2A where the platens are rotated at an angle of 90°.

The rotary motors 313 are used to rotate the spokes 315 to a predetermined angle. In some embodiments, the rotary motors 313 may rotate the spokes 315 at an angle between 0° and 90°. In some embodiments, the rotary motors 313 may rotate the spokes 315 at an angle between −90° and 90°. For example, the rotary motors 313 may rotate the platens 320 at an angle of 45°, as shown in FIG. 4A. Additionally, the rotary motors 313 may rotate the platens 320 at an angle of 90°, as shown in FIG. 4B.

When rotated at an angle of 90°, the central hub 310 may be rotated about the central axis 311 so that one of the platens 320, such as platen 320a, is horizontal. In this horizontal position, a workpiece may be mounted on or dismounted from the platen 320a. After the workpiece has been mounted or dismounted, the central hub 310 may then be rotated about the central axis 311 so as to move another platen 320 into the horizontal position. In one embodiment, the central hub 310 may rotate by an angle of 360°/P about the central axis 311, where P is the number of platens 320, assuming that the spokes 315 are equally distributed around the perimeter of the central hub 310.

Figure 5:
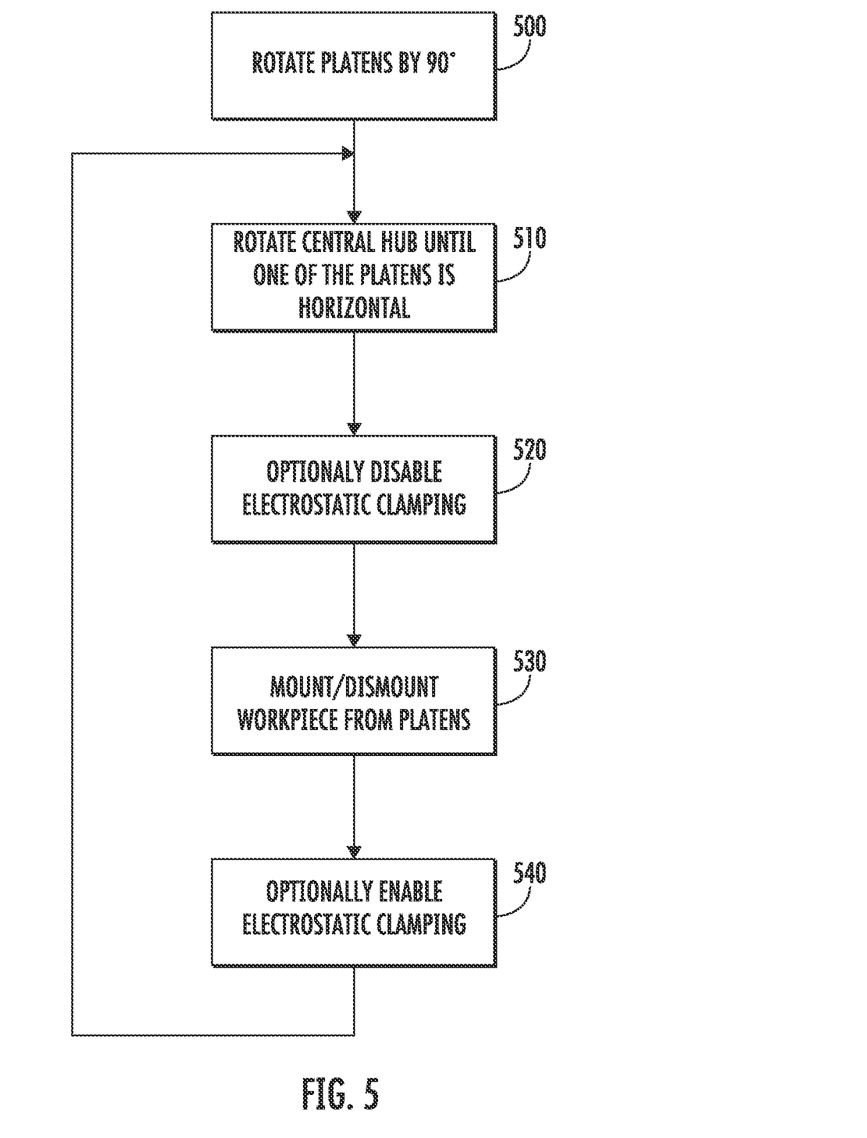
FIG. 5 illustrates a sequence to mount and dismount workpieces on the spinning disk according to one embodiment.

Thus, in one embodiment, a method of mounting and dismounting a plurality of workpieces using the central hub 310 is shown in FIG. 5. As shown in Box 500, the rotary motors 313 rotate the platens by an angle of 90°. Then, as shown in Box 510, the central hub 310 is rotated about its central axis 311 so that one of the platens 320a is horizontal. If a workpiece is being removed, the electrostatic clamp is disabled when the platen is in the horizontal position, as shown in Box 520. The workpiece is then placed on or removed from the platen 320a, as shown in Box 530. If a workpiece has been placed on the platen 320a, the electrostatic clamp is then enabled, as shown in Box 540. The central hub 310 is then rotated until another platen is in the horizontal position, as shown in Box 510. The sequence shown in Boxes 510-540 is then repeated until workpieces have been mounted on and/or dismounted from all of the platens 320 or there are no more workpieces.

Note that in some embodiments, such as that shown in FIG. 5, all of the platens 320 are rotated by an angle of 90° (see Box 500) before workpieces are mounted on and/or dismounted from any of the platens.

However, other embodiments are possible. In other embodiments, each platen 320 is rotated immediately before the workpiece is mounted on and/or dismounted from that platen 320. In other words, Box 500 may be moved so that it is executed each time the central hub is rotated.

In some embodiments, the workpieces are processed in groups that may be transported in a FOUP. In certain embodiments, a FOUP may contain 25 workpieces. Thus, if the number of platens is not a factor of the number of workpieces in a FOUP, there will be unoccupied platens. As an example, assume that there are 25 workpieces in a FOUP and there are 9 platens 320 around the central hub 310. During a first pass, 9 workpieces may be processed. During a second pass, a second set of 9 workpieces may be processed. During the third pass, there are only 7 workpieces to be processed. Therefore, there are two unoccupied platens during this third pass.

Figure 6:
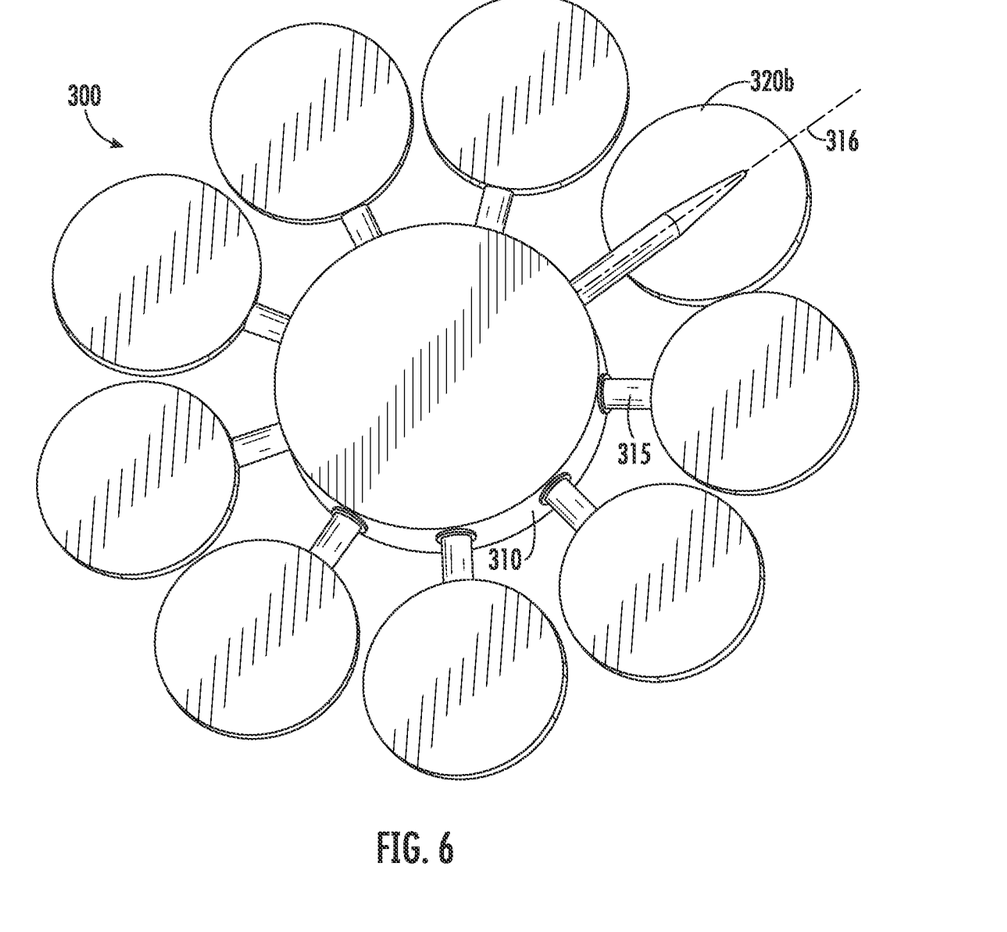
FIG. 6 shows the spinning disk of FIG. 2A where one of the platens is rotated at an angle of 180°.

In certain embodiments, the central hub 310 addresses this issue by allowing the platens 320 to be rotated at an angle of 180°, such that the back of the platen 320 is struck by the spot ion beam 155. This is shown in FIG. 6, where platen 320b has been rotated 180° about axis 316 so that its back surface is facing the spot ion beam.

This approach eliminates the need for dummy wafers, which are used to protect the top surface of the platen 320 from direct impact from the spot ion beam 155. Rather than using a dummy wafer to protect the top surface of the platen 320, the unoccupied platen is simply rotated 180° so that its back surface faces the spot ion beam 155.

In some embodiments, the number of platens 320 that are disposed on the spinning disk 300 may be related to the number of workpieces that are contained in a FOUP so as to minimize idle time. For example, it may be advantageous for the number of workpieces in a FOUP to be a multiple, or nearly a multiple of the number of platens 320. Thus, if there are 25 workpieces in a FOUP, the spinning disk may have 5 or 25 platens 320 on the spinning disk. This ensures that there are no unoccupied platens. However, other numbers of platens may be useful. If there are 13 platens, all of the workpieces in the FOUP may be processed in two passes, with only one unoccupied platen. If there are 9 platens, all of the workpieces in the FOUP may be processed in three passes, with only two unoccupied platens. Of course, other numbers of platens may be utilized.

Figure 7:
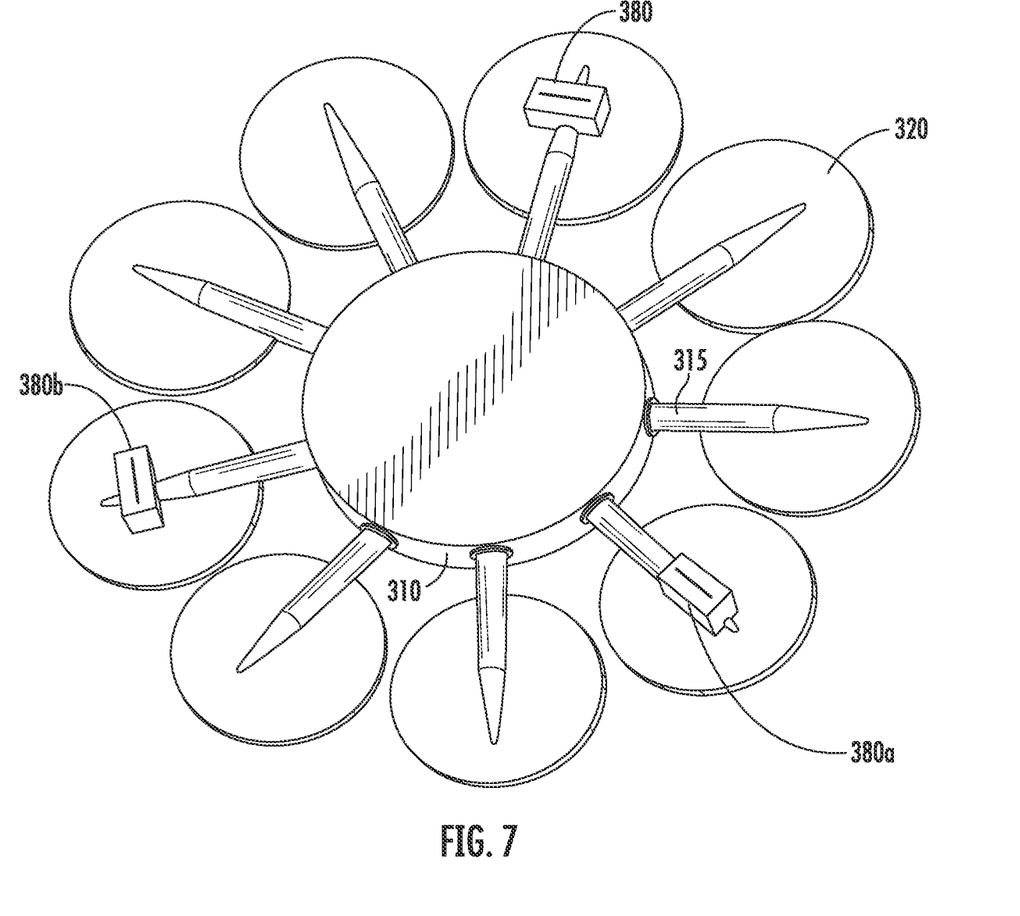
FIG. 7 shows sensors disposed on the back surface of platens, which are visible when the platen is rotated at an angle of 180°.

In certain embodiments, information about the spot ion beam may be collected by the platen 320b that is rotated 180°. For example, as shown in FIG. 7, sensors 380 may be disposed on the back surfaces of one or more platens 320. These sensors 380 may be Faraday sensors. The sensors 380 may be used to measure a characteristic of an ion beam and for dosimetry measurements and beam uniformity measurements. The outputs from these sensors 380 may be in communication with the hub controller 312. In some embodiments, the hub controller 312 returns information about the characteristics of the ion beam to the controller 180 via the communication signals 326. This may allow better beam control.

Figure 8A:
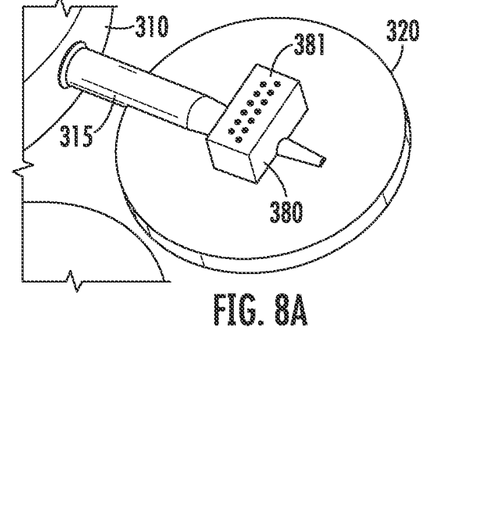
FIG. 8A shows a sensor according to one embodiment.
Figure 8B:
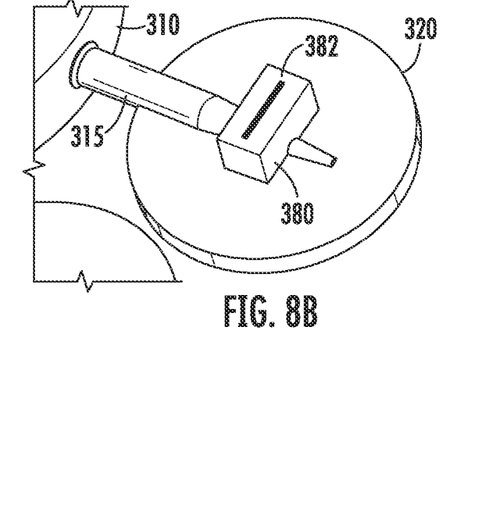
FIG. 8B shows a sensor according to a second embodiment.

In certain embodiments, the sensors 380 may comprise an array of holes 381 or other apertures, as shown in FIG. 8A. In other embodiments, the sensors may comprise one or more slots 382, as shown in FIG. 8B.

Referring to FIG. 7, the sensors 380 may be oriented differently. For example, one or more sensors 380, such as sensor 380a, may be oriented such that the longer dimension is in the radial direction. One or more sensors 380, such as sensor 380b, may be oriented such that the longer dimension is perpendicular to the radial direction. The orientation of the sensor may optimize its measurements in one of the two directions of movement. For example, sensor 380b may be better oriented to observe the beam along path 318. Sensor 380a may be better oriented to observe the beam along path 317.

The system and method described herein have many advantages. The present spinning disk allows the platens 320 to utilize electrostatic clamping to clamp the workpiece. One benefit of this approach is that the platens can then be tilted at any desired implant angle, which may not be possible with existing mechanical clamping approaches. Specifically, the use of electrostatic clamping enables the axis of rotation of the platen to be parallel to ion beam when a zero degree implant is desired. This eliminates the angle error associated with previous disk designs. Previous disks had pedestals mounted at an angle relative to the spin axis so when it was desired to perform a zero degree implant, the disk spin axis would not be aligned with the ion beam resulting in implant angle error. Further, the current spinning disk allows for a straightforward mounting and dismounting procedure due to the ability to rotate the platens by 90°. This allows the workpieces to be exchanged while they are horizontal. Furthermore, in certain embodiments, dummy wafer may be eliminated by rotating unoccupied platens by 180°. In certain embodiments, these rotated platens are also used to collect information about the spot ion beam at the exact position where it strikes the workpieces.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A spinning disk to process a plurality of workpieces, comprising:
   a central hub adapted to rotate about a central axis;
   a plurality of spokes extending radially outward from the central hub, wherein each of the plurality of spokes is adapted to rotate about a respective axis extending radially from the central hub;
   a platen disposed on a distal end of each of the plurality of spokes, each platen comprising a plurality of electrodes and configured to electrostatically clamp a respective workpiece; and
   a plurality of rotary motors disposed in the central hub, each in communication with a respective one of the plurality of spokes and configured to rotate the respective one of the plurality of spokes.

2. The spinning disk of claim 1, wherein each rotary motor rotates the respective one of the plurality of spokes at an angle between −90° and 90°.

3. The spinning disk of claim 1, wherein each rotary motor rotates the respective one of the plurality of spokes at an angle of up to 180°.

4. The spinning disk of claim 1, further comprising a sensor disposed on a back surface of at least one of the platens to measure a characteristic of an ion beam.

5. The spinning disk of claim 4, wherein the sensor comprises an array of holes.

6. The spinning disk of claim 4, wherein the sensor comprises a slot.

7. An ion implantation system, comprising:
   an ion source to generate ions;
   an accelerator to accelerate the ions and create a spot beam; and
   the spinning disk of claim 1.

8. The ion implantation system of claim 7, wherein the spinning disk is configured to translate in a direction perpendicular to the central axis resulting in a two dimensional mechanical scanning.

9. The ion implantation system of claim 8, wherein the central hub is rotatably mounted to a structure, wherein the structure translates linearly in a direction perpendicular to the central axis.

10. The ion implantation system of claim 8, wherein the central hub is rotatably mounted to a pivoting arm, wherein the pivoting arm rotates so as to translate the spinning disk in a direction perpendicular to the central axis.

11. A spinning disk to process a plurality of workpieces, comprising:
    a central hub adapted to rotate about a central axis;
    a hub controller disposed within the central hub;
    a plurality of spokes extending radially outward from the central hub, wherein each of the plurality of spokes is adapted to rotate about a respective axis extending radially from the central hub;
    a platen disposed on a distal end of each of the plurality of spokes and configured to electrostatically clamp a respective workpiece; and
    a plurality of rotary motors disposed in the central hub, each in communication with a respective one of the plurality of spokes and configured to rotate the respective one of the plurality of spokes.

12. The spinning disk of claim 11, wherein the hub controller is configured to execute a sequence to mount a workpiece on a platen, the sequence to mount the workpiece comprising:
    actuating one of the plurality of rotary motors to rotate the platen such that a front surface of the platen is horizontal to allow the workpiece to be placed on the front surface; and
    enabling electrostatic clamping of the platen after the workpiece has been placed on the front surface.

13. The spinning disk of claim 12, comprising valves to regulate a flow of backside gas to one or more of the platens.

14. The spinning disk of claim 13, wherein the sequence to mount the workpiece further comprises:
    enabling the flow of backside gas after the workpiece has been electrostatically clamped.

15. The spinning disk of claim 14, wherein the sequence to mount the workpiece further comprises:

actuating one of the plurality of rotary motors to rotate the platen such that the front surface of the platen is at a desired angle of implant after the workpiece has been electrostatically clamped.

16. The spinning disk of claim 11, wherein the hub controller is configured to execute a sequence to dismount a workpiece from a platen, the sequence comprising:
actuating one of the plurality of rotary motors to rotate the platen such that a front surface of the platen is horizontal to allow the workpiece to be removed from the front surface; and
disabling electrostatic clamping of the platen after the platen is rotated to a horizontal position.

17. The spinning disk of claim 16, comprising valves to regulate a flow of backside gas to one or more of the platens.

18. The spinning disk of claim 17, wherein the sequence to dismount the workpiece further comprises:
disabling the flow of backside gas before the electrostatic clamping has been disabled.

19. The spinning disk of claim 11, further comprising a sensor disposed on a back surface of at least one of the platens and wherein the hub controller is configured to execute a sequence to measure characteristics of an incoming ion beam, the sequence comprising:
actuating one of the plurality of rotary motors to rotate the platen such that the back surface of the platen is exposed to the incoming ion beam so that the incoming ion beam strikes the sensor; and
receiving an output from the sensor, wherein the output is indicative of a characteristic of the incoming ion beam.

20. The spinning disk of claim 11, comprising a temperature sensor disposed in one or more of the platens, wherein the hub controller monitors a temperature of the platen.

* * * * *